Figure 1:
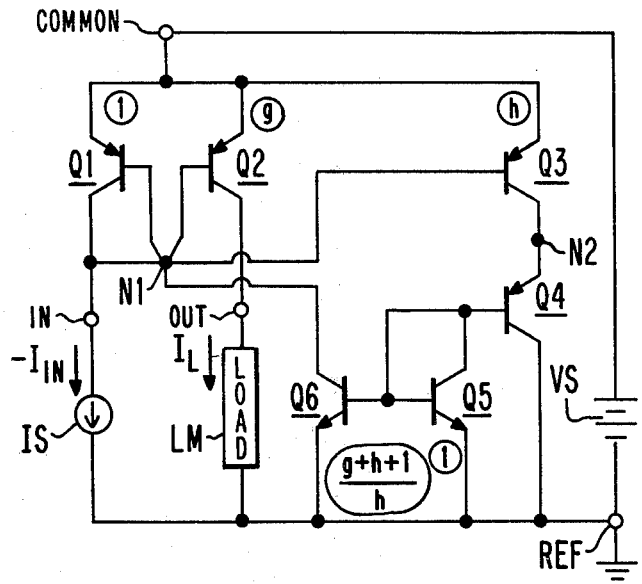

United States Patent [19]

Schade, Jr.

[11] 4,345,216

[45] Aug. 17, 1982

[54] COMPENSATION OF BASE-CURRENT-RELATED ERROR IN CURRENT MIRROR AMPLIFIER CIRCUITRY

[75] Inventor: Otto H. Schade, Jr., No. Caldwell, N.J.

[73] Assignee: RCA Corporation, New York, N.Y.

[21] Appl. No.: 162,939

[22] Filed: Jun. 25, 1980

[51] Int. Cl.³ .............................................. H03F 3/04
[52] U.S. Cl. .................................... 330/288; 330/293
[58] Field of Search ....................... 330/288, 291, 293; 323/315, 316

[56] References Cited

U.S. PATENT DOCUMENTS

| | | | |
|---|---|---|---|
| 3,668,541 | 6/1972 | Pease | 330/289 |
| 3,714,600 | 1/1973 | Kuijk et al. | 330/288 |
| 3,717,821 | 2/1973 | Amemiya et al. | 330/288 X |
| 3,947,704 | 3/1976 | Blauschild | 330/288 X |

OTHER PUBLICATIONS

Limberg, "Current Amplifier Circuits", RCA *Technical Notes*, TN 1187, Aug. 12, 1977.

"Transistor Circuits", Abstract of United Kingdom Pat. No. 1,444,811, dated Oct. 5, 1973.

*Primary Examiner*—James B. Mullins
*Attorney, Agent, or Firm*—Eugene M. Whitacre; Paul J. Rasmussen; Allen LeRoy Limberg

[57] ABSTRACT

A current mirror amplifier comprising a master mirroring transistor with collector-to-base connection for adjusting its emitter-to-base potential to condition it to conduct input current applied to its collector-emitter path, a plurality of slave mirroring transistors arranged to respond to an emitter-to-base potential equal to that of the master mirroring transistor for conducting an output current through its emitter-collector path proportional to the input current, a further transistor with its collector-emitter path arranged to sense the collector current of one of the slave mirroring transistors, and a component current mirror amplifier responding to the base current of the further transistor flowing through its input connection to supply a substantial share of the base current needs of said mirroring transistors at its output connection.

6 Claims, 3 Drawing Figures

COMPENSATION OF BASE-CURRENT-RELATED ERROR IN CURRENT MIRROR AMPLIFIER CIRCUITRY

The present invention relates to compensating for the base-current-related error in current mirror amplifier circuitry.

A current mirror amplifier, or CMA, is a transistor current amplifier, frequently used in monolithic integrated circuits, having a current gain that depends upon the proportionality between the output-current-versus-input-voltage characteristics of master and slave mirroring transistors concurrently fabricated by the same process steps. This proportionality is of predetermined value, within close tolerances for a substantial portion of the units made in the course of mass manufacturing. Of particular concern are CMA's using bipolar transistors, in which direct-coupled collector-to-base feedback adjusts the emitter-to-base voltage of the master mirroring transistor to condition it to conduct input current applied to its collector-emitter path, and in which the emitter-to-base voltage of the master mirroring transistor is applied as the emitter-to-base voltage of the slave mirroring transistor to condition it to conduct through its collector-emitter path an output current proportionally related to the input current. Still more particularly, concern is for this type of CMA in which the direct-coupled feedback is provided without amplification. In such CMA's the base current requirements of the master and slave mirroring transistors must be met by diverting from the collector-emitter path of the master mirroring transistor a portion of the current supplied from the source of input current. The output current flowing through the collector-emitter path of the slave mirroring transistor is reduced in proportion to the reduction in the flow of current through the collector-emitter path of the master mirroring transistor. This leads to a departure of the current gain of the CMA from the proportionality between the output current versus input voltage characteristics of the mirroring transistors, which departure is termed "base-current-related error".

A current mirror amplifier embodying the present invention employs a plurality of slave mirroring transistors, and base-current-related errors are suppressed by supplying the base currents of the mirroring transistors with apparatus of the following sort, rather than supplying these base currents solely from the source of input current. The emitter-collector path of a further transistor is used to sense the collector current of one of the slave mirroring transistors. Means, such as a component CMA, responds to the base current of this further transistor, as received at its input connection, to supply a substantial share of the proportionally related base current requirements of the mirroring transistors.

Figure 2:
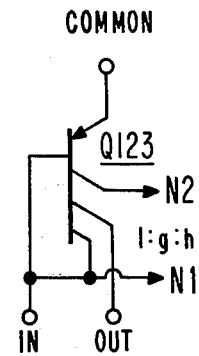
Figure 3:
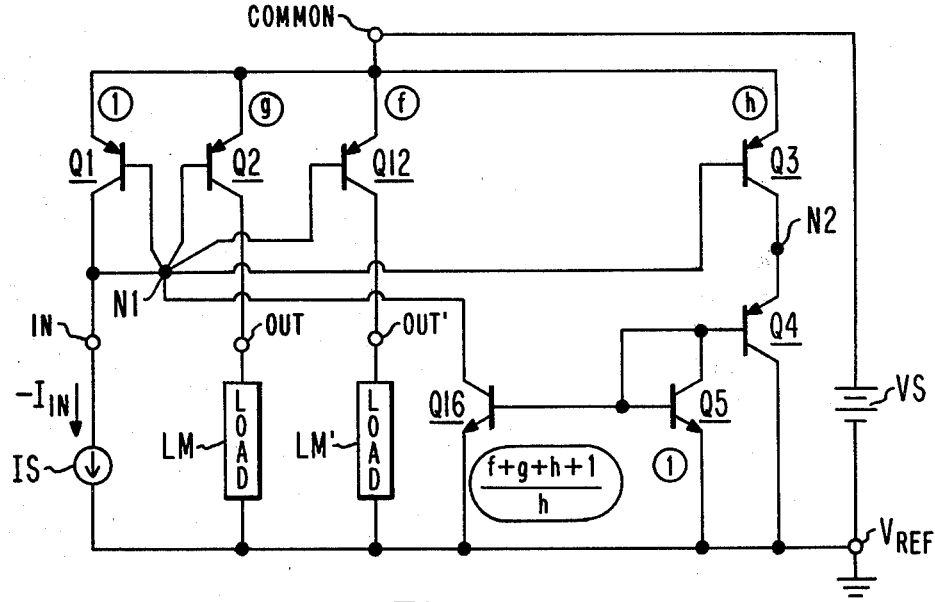

In the drawing:

FIGS. 1 and 3 are schematic diagrams of CMA's embodying the present invention; and FIG. 2 is a schematic diagram of a modification that can be made to the FIG. 1 CMA.

In the FIG. 1 CMA PNP transistors Q1 and Q2 are the master and slave mirroring transistors, respectively, with their collector electrodes connecting to the input terminal IN of the CMA and to its output terminal OUT, respectively. A source of input current IS connects to terminal IN to withdraw current from that terminal. This current flows through a voltage supply VS to the terminal COMMON of the CMA, shared by its output and input circuits, providing return connection for its input and load currents. The negative pole of supply VS is shown as being grounded via terminal REF. Q1, Q2 and PNP transistors Q3 and Q4 each have substantially the same common-emitter forward current gain (or $\beta$) as the others do, usually by virtue of their concurrent fabrication by the same processing steps in a monolithic integrated circuit. In conventional i-c technology, PNP transistors are lateral-structure devices, which construction places upward limits on their $h_{fe}$'s as may make the base-current-related error appreciable in CMA's that employ them. Q1, Q2 and Q3 are arranged to have equal respective emitter-to-base voltages $V_{BE1}$, $V_{BE2}$ and $V_{BE3}$; this may be done by interconnecting their bases at node N1 and by connecting their emitters to the common terminal COMMON of the CMA without substantially intervening impedance, as shown.

Q1, Q2 and Q3 are so proportioned that their respective collector currents are related in 1:g:h ratio for $V_{BE1}=V_{BE2}=V_{BE3}$, as indicated by the encircled 1, g, and h near their respective emitter electrodes. As is known, conductances in 1:g:h ratio may be inserted into the connections of the emitters of Q1, Q2 and Q3 to terminal COMMON without interfering with mirroring action between these transistors or the ratio of their collector currents. As is known, conductances in 1:g:h ratio may be inserted into the connections of the bases of Q1, Q2 and Q3 to node N1 without interfering with mirroring action between these transistors or the ratio of their collector currents. Nominally, then, the current gain of the FIG. 1 CMA as between its terminals IN and OUT is $-g$, neglecting base-current-related error, causing a load current $I_L$ substantially $-g$ times the input current $I_{IN}$ to be supplied to load means LM. Load means LM has a conductive path for direct and varying components of load current $I_L$ to the negative pole of voltage supply VS, the positive pole of which connects to terminal COMMON of the CMA to complete the loop for load current that also includes the collector-emitter path of Q2.

As pointed out above, it is desirable to supply the base currents of the mirroring transistors Q1, Q2 and Q3 (Q3 being in effect an additional slave mirroring transistor) to the extent possible by means exclusive of the source IS of input current $I_{IN}$. To this end, the collector current Q3, the amplitude of which is to close approximation h times $I_{IN}$, is applied to a second node N2, to which the emitter of Q4 connects, to cause a base current $hI_{IN}/(\beta+1)$ to flow to the input connection of a component CMA comprising NPN transistors Q5 and Q6. Q5 and Q6 are vertical-structure transistors with relatively high common-emitter forward current gain, in conventional monolithic integrated circuitry. Q6 and Q5 have collector currents in $(g+h+1)/h:1$ ratio, establishing the current gain of the component CMA they form to be close to $-(g+h+1)/h$. So this component CMA demands a current at its output connection to node N1 substantially equal to $(g+h+1)I_{IN}/(\beta+1)$. Apportioned in 1:g:h ratio this current supplies $\beta/(\beta+1)$ times the base current requirements of Q1, Q2 and Q3 that would be required to support respective collector currents of $I_{IN}$, $gI_{IN}$ and $hI_{IN}$ from transistors Q1, Q2 and Q3. The current gain of the complete CMA of FIG. 1 as between its terminals IN and OUT is thus $-g$ with base-current-related error reduced by about $\beta$ times.

This reduction is achieved by regenerative current feedback, of course, but there is no appreciable tendency towards self-oscillation in the current feedback loop. This can be appreciated by breaking the loop by disconnecting the collector of Q3 from node N2. Current $I_X$ injected into the emitter of Q4 via node N2 will cause a base current response $1/(\beta+1)$ times as large from Q4, which is then multiplied by $(g+h+1)/h$ times in the component CMA connection of Q5 and Q6. This $[I_X/(\beta+1)][(g+h+1)/h]$ current does not divide in 1:g:h ratio between the base electrodes of Q1, Q2 and Q3 unless the current source IS diverts the collector current of Q1 to itself as $-I_{IN}$, preventing the flow of the collector current to node N1 via the collector-to-base feedback connection. Presuming the current $I_X$ to be a spurious current generated by self-oscillation, when the loop connection is restored, the $[I_X/(\beta+1)][(g+h+1)/h]$ current is divided in $\beta$:1:g:h ratio between the collector of Q1, the base of Q1, the base of Q2, and the base of Q3, respectively. That is, the base current to Q3 has a value $[I_X/(\beta+1)][(g+h+1)/(\beta+g+h+1)]$, causing its collector to supply a current $\beta$ times as large. The collector current of Q3 has a value, then of $I_X[\beta/(\beta+1)][(g+h+1)/(\beta+g+h+1)]$. This response current is appreciably smaller than the current $I_X$ injected into node N2, so it is apparent that the loop formed by reconnection of the collector of Q3 to node N2 is not self-oscillatory, inasmuch as the open-loop gain is appreciably less than unity.

The separate lateral-structural PNP transistors Q1, Q2 and Q3 of FIG. 1 may be replaced by a multiple-collector lateral-structure transistor Q123 supplying collector currents in 1:g:h ratio as shown in FIG. 2.

FIG. 3 illustrates how the present invention may be used in a plural-output CMA. The FIG. 3 CMA differs from that of FIG. 1 in that it has a second output terminal OUT' for supplying a current substantially $-f$ times as larger at $-I_{IN}$ to a further load means LM', f being a positive number, and in that to implement this the following modifications are incorporated. An additional PNP transistor Q12 is connected as a further slave mirroring transistor to supply its collector current to terminal OUT', its collector current for any given value of emitter-to-base voltage being f times that of Q1. NPN transistor Q6 is replaced, in its component CMA connection with Q5, by NPN transistor Q16. Q16 is so proportioned respective to Q5 as to increase the current gain of the component CMA to be substantially equal to $-(f+g+h+1)/h$. The output current of this component CMA is thus augmented in the amount required to supply substantially $\beta/(\beta+1)$ times the required base currents of the mirroring transistors Q1, Q2, Q3 and Q12. This technique of increasing the gain of the component CMA to accommodate an additional slave mirroring transistor can be extended to multiple-output CMA's with any number of output terminals, of course.

An advantage of sensing the collector current of Q3 with the emitter collector path of Q4, rather than attempting to sense the collector or emitter current of one of the slave forming mirroring transistors supplying a respective output terminal, is that each slave mirroring transistor supplying a respective output terminal has no restriction on the positive-going voltage swing at its collector until the voltage swings within a few tenths volt of the potential applied to terminal COMMON. This sensing of the collector current of a transistor with emitter-base junction parallelly connected with that of an output transistor, in order to develop base current compensation for both of them (as well as other transistors, if necessary), is an underlying fundamental aspect of the present invention.

If one desires a further current substantially proportional to $I_{IN}$, but does not require that base-current-related error be minimized in this current, one may use the combined collector current of Q4 and emitter currents of Q5 and Q6. Or one may use the collector current of Q4, introducing potential offsetting means between the base of Q4 and the interconnected bases of Q5 and Q6 (or Q16), or introducing potential offsetting means between terminal REF and the interconnected emitters of Q5 and Q6 (or Q16), when the restrictions on positive-ward collector voltage swing of Q4 pose a problem.

If one considers the cascade connection of Q4 and of the component CMA comprising Q5 and Q6 (or Q16) one will recognize it to be a current amplifier with a gain related in inverse proportion to unity plus the $\beta$ of the mirroring transistors. Other amplifiers of this type can be substituted to provide further embodiments of the present invention. The current amplifier shown in FIG. 5 of RCA Technical Note No. 1187 authored by Allen LeRoy Limberg, entitled CURRENT AMPLIFIER CIRCUITS, and mailed Aug. 12, 1977 incorporates a suitable current amplifier, by way of example, used therein for supplying base current to an output transistor.

What is claimed is:

1. A current mirror amplifier comprising:
   an input terminal for connecting to a source of output current;
   an output terminal for supplying load current to a load;
   a common terminal for providing return connection for said input and load currents;
   first, second, third and fourth transistors with matched current gain characteristics having respective collector electrodes, said fourth transistor having respective base and emitter electrodes, and the other of these transistors having amongst them at least one base electrode connected to said input terminal and at least one emitter electrode connected to said common terminal, the collector electrodes of said first and second transistors being respectively connected to said input terminal and to said output terminal, the collector electrode of said third transistor being connected to the emitter electrode of said fourth transistor;
   means for applying an operating potential to the collector electrode of said fourth transistor; and
   means responding to the flow of current through the base electrode of said fourth transistor for supplying a substantial share of the proportionally related base current requirements of said first, second, and third transistors, rather than imposing it upon said source of input current.

2. A current mirror amplifier as set forth in claim 1 wherein said means responding to the flow of current through the base electrode of said fourth transistor comprises:
   a component current mirror amplifier with an input connection to which the base electrode of said fourth transistor connects and with an output connection connected to said input terminal.

3. A current mirror amplifier as set forth in claim 1 or 2 including:

a number, one or more, of further output terminals;

a like number of further transistors with matched current gain characteristics respective to said first, second, third and fourth transistors, each of said further transistors having a collector electrode connected to a respective one of said further output terminals and having an emitter-to-base potential applied thereto equal to those of said first, second and third transistors.

4. A current mirror amplifier comprising:

at least one output terminal, and input and common terminals;

a master mirroring transistor and a plurality of slave mirroring transistors having respective common-emitter forward current gains substantially equal to a positive number $\beta$, each having its base electrode connected to said input terminal and having its emitter electrode connected to said common terminal, said master mirroring transistor having a collector electrode connected to said input terminal, and each except the first of said slave mirroring transistors having a respective collector electrode connected to a respective output terminal;

a component current amplifier having an input connection from the collector electrode of said first slave mirroring transistor, having an output connection to said input terminal, and exhibiting a current gain substantially equal to $-G/(\beta+1)$ between its input and output connections where G is a positive number greater than unity, chosen sufficiently large that a substantial share of the base current requirements of said mirroring transistors are supplied from the output connection of said component current amplifier, and where said component current amplifier includes a further transistor having a collector electrode connected for conditioning said further transistor to exhibit a common-emitter forward current gain substantially equal to $\beta$, said further transistor being connected to exhibit a current gain substantially equal to $1/(\beta+1)$.

5. A current mirror amplifier as set forth in claim 4 wherein said component current amplifier includes:

said further transistor having an emitter electrode connected to the input connection of said component current amplifier, and having a base electrode; and means responsive to the base current of said further transistor for supplying a current of $-G$ times as large at the output connection of said component current amplifier.

6. In combination:

first, second, and third transistors having base, emitter and collector electrodes and exhibiting similar current gains as between their base and collector electrodes;

means for applying an input current between an interconnection of the emitter electrodes of said first and second transistors and an interconnection of the base electrodes of said first and second transistors;

means for extracting an output current from the collector electrode of said first transistor;

means for applying the collector current of said second transistor to the emitter electrode of said third transistor;

means for applying an operating potential to the collector electrode of said third transistor; and a current mirror amplifier having an input connection to which the base electrode of said third transistor connects and having an output connection to the interconnection between the base electrodes of said first and second transistors.

* * * * *